United States Patent [19]

Reeb

[11] Patent Number: 4,694,283
[45] Date of Patent: Sep. 15, 1987

[54] IDENTIFICATION DEVICE IN THE FORM OF A TAG-LIKE STRIP AFFIXABLE TO AN ARTICLE

[76] Inventor: Max E. Reeb, Helfensteinstasse 7, D-7336 Uhingen, Fed. Rep. of Germany

[21] Appl. No.: 513,970
[22] PCT Filed: Oct. 29, 1982
[86] PCT No.: PCT/DE82/00210
  § 371 Date: Jun. 29, 1983
  § 102(e) Date: Jun. 29, 1983
[87] PCT Pub. No.: WO83/01697
  PCT Pub. Date: May 11, 1983

[30] Foreign Application Priority Data
  Oct. 30, 1981 [DE] Fed. Rep. of Germany ....... 3143208

[51] Int. Cl.$^4$ .............................................. G08B 13/24
[52] U.S. Cl. ..................................... 340/572; 29/846; 333/219; 428/901
[58] Field of Search ......................... 340/572; 428/901; 333/219; 29/846, DIG. 3, DIG. 16, DIG. 40

[56] References Cited

U.S. PATENT DOCUMENTS 4,311,992 1/1982 DeChant .............................. 340/572
4,369,557 1/1983 Vandebult ........................... 340/572

Primary Examiner—Glen R. Swann, III

[57] ABSTRACT

An identification device in the form of a tag-like strip, affixable to an article, for use in an electronic security system comprising opposingly situated conductor strip portions which may be punched out of a metal foil. The conductor strip portions are folded together along suitably positioned fold lines so that mutually superposed conductor strip portions form an uninterrupted winding of inductive elements having a dielectric positioned therebetween. The conductor strip portions can be fabricated on continuous roll and separated by transverse perforations.

30 Claims, 27 Drawing Figures

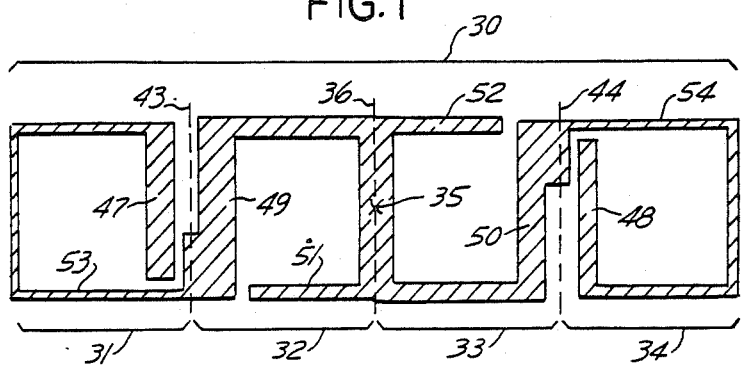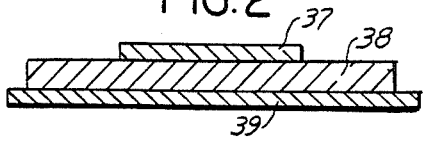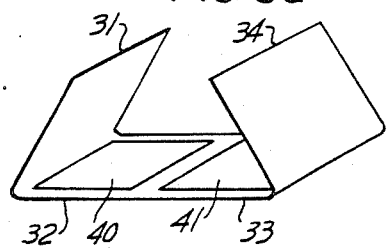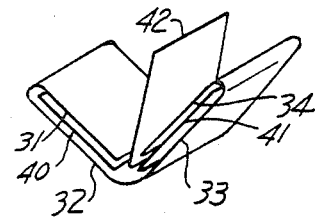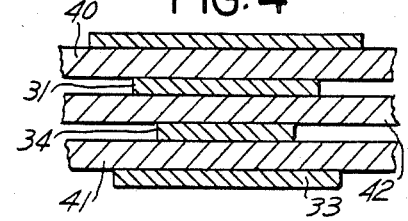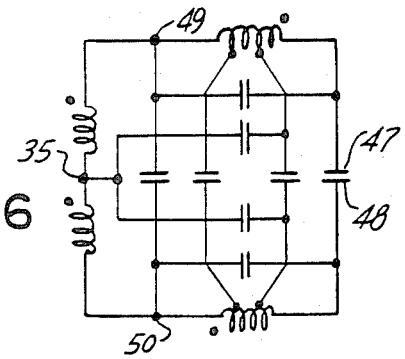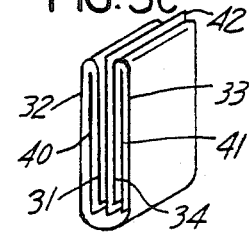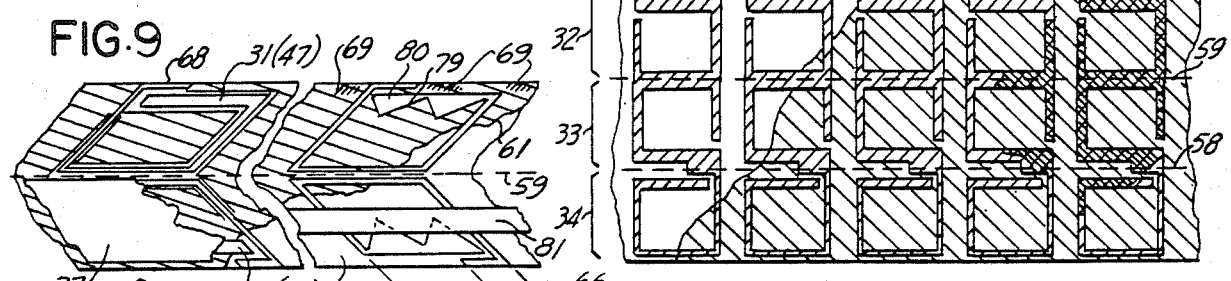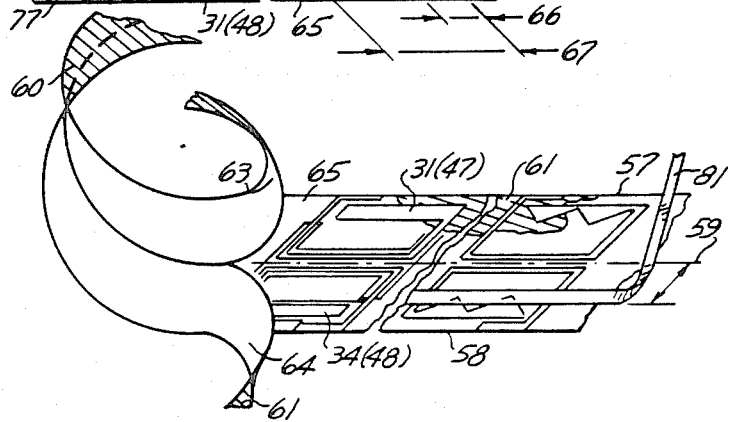

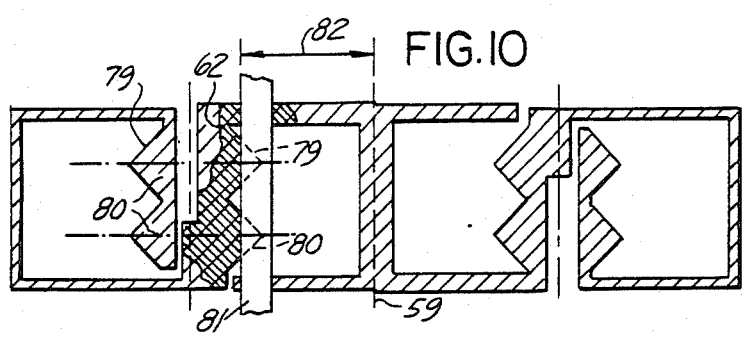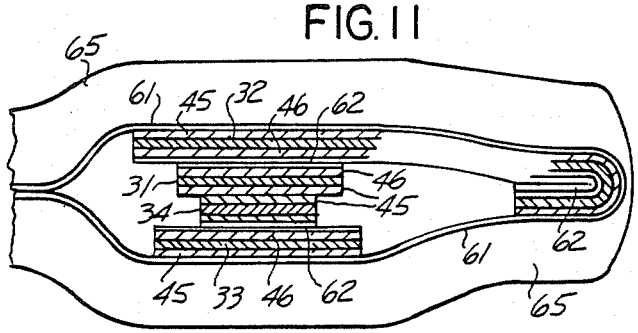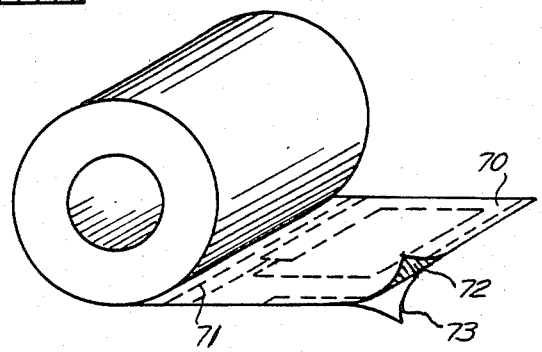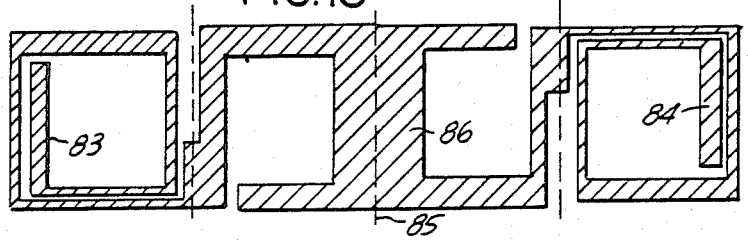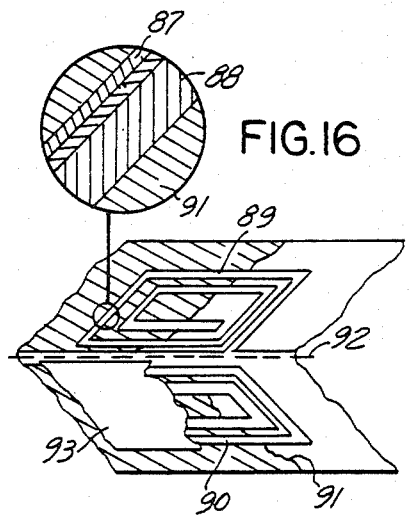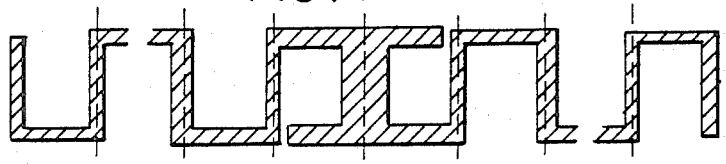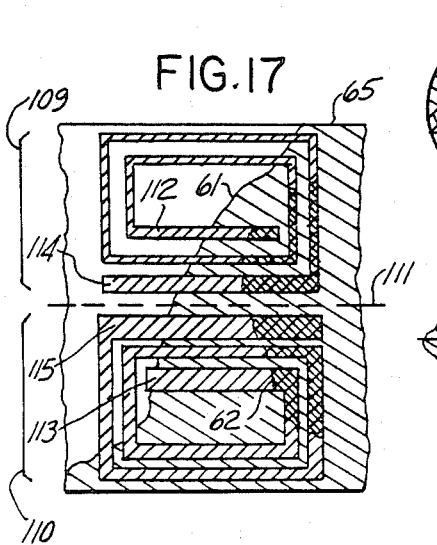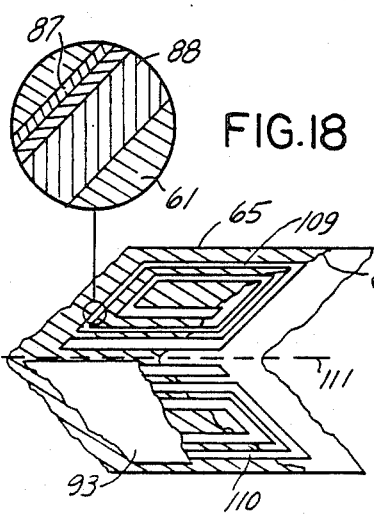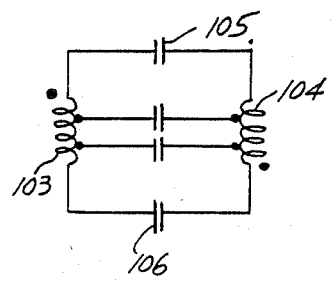

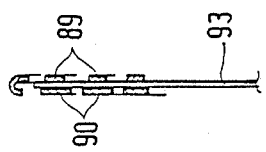
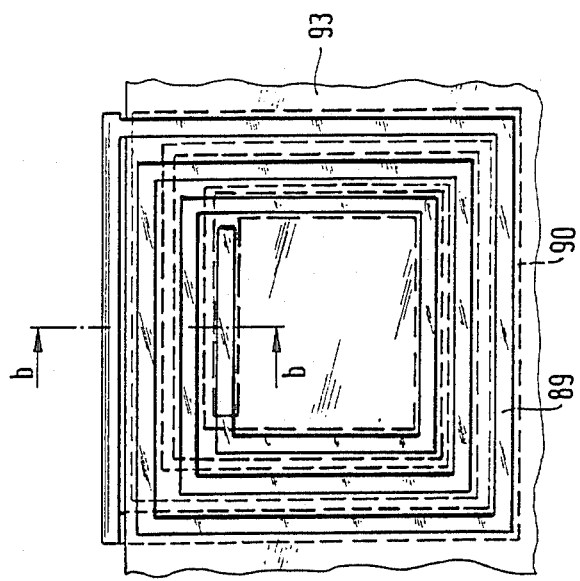

IDENTIFICATION DEVICE IN THE FORM OF A TAG-LIKE STRIP AFFIXABLE TO AN ARTICLE

BACKGROUND OF THE INVENTION

1. Field of the Invention

The invention relates to an identification device in the form of a tag-like strip affixable to an article and comprising at least one inductive member formed of flat conductor strips and one capacitive member formed of superposed conductor strip portions with a dielectric interposed therebetween, said capacitive member forming with the inductive member a closed resonant circuit.

Identification devices of this type have been known, for example, from German AS No. 2,826,861. They essentially contain an electrical parallel resonant circuit and are contemplated for generating characteristic signals permitting the identification thereof in a high frequency electromagnetic field. Such passive identification devices are used in production engineering for identifying work pieces, in analysis technololgy for identifying samples, as safeguarding means and as identifying sensors in articles' safeguarding systems, especially antitheft systems.

2. The Prior Art

If such devices are required in very large quantities the manufacturing costs are of essential significance to the economical use of the system. Conventional identification devices are manufactured, for example, by etching conductor strips out of metal foils applied on both sides of a flexible, electrically non-conductive carrier sheet, as described in the U.S. Pat. No. 3,913,219. The etched conductor strips form the required inductive member, while the capacitive member of the resonant circuit is formed by formed by opposed conductive areas and the interposed dielectric carrier sheet. In order to connect the conductor strips on the two sides of the carrier sheet so that together they cooperate to form an inductive member, contact through the carrier sheet is necessary. Furthermore, manufacturing methods requiring etching on both sides are very expensive and contacting through the carrier sheet requires a piece-by-piece check of each individual resonant unit.

SUMMARY OF THE INVENTION

It is the object of the invention to provide an identification device and a method for producing same which permit economical mass production so that the identification devices are disposable for one-time use. Furthermore, the identification devices should have close tolerances and a high degree of reliability and yet are to lend themselves to mass production at low cost.

This object is realized by an identification device of the type disclosed at the outset which, according to the invention, is characterized in that the conductor strips are arranged in at least two superposed areas formed by folding. Hence, the invention is based on the idea to arrange the windings of the inductive member in superposed relationship by so folding a conductor strip structure that the number of windings is virtually unlimited and the required distributed capacities can be provided by selective interposition of dielectric layers between conductor strip portions folded one onto the other. Since the conductor strips may be made extremely thin, a sufficiently high inductance and capacitance value can be reached and nevertheless the entire identification device is very thin. Therefore, the identification device can be made very flexible and in particular, it can be processed like a conventional paper, plastic or cardboard tag. Since the individual windings of the inductive member may be directly superposed, excellent magnetic coupling is achieved between the individual windings so that but minor leakage inductance occurs and thus precise transformation ratios of the distributed capacities contributing to the total effective resonant circuit capacitance can be maintained.

According to a preferred embodiment of the invention, the inductive and capacitive members are formed by folding together a conductor structure applied on a flexible electrically insulating carrier sheet which can be unfolded into a single plane. The structurally desired fold lines are marked by perforations, properly located and suitably located folding lines or the like. The conductor strip structure may be coextensive from one fold plane to the next so that the windings of the inductance extend continuously from one plane to the other. Depending on the particular case of application, however, merely capacitive coupling can be provided between two superposed conductive members of the unit by interposition of a dielectric between the superposed conductor strip portions.

According to a further preferred embodiment of the invention the conductor strips have different configurations and/or dimensions in the superposed layers. In practice the perforations or suitably located folding lines marking the fold lines will have tolerances regarding their position relative to the conductor strip structure. Also the folding or lapping operation as such may result in additional manufacturing tolerances. This would change the value of a capacitance formed by two mutually overlying conductor strip portions of equal size between which a dielectric is interposed, since the effective capacitively reactive area decreases in case of parallel shift of the capacitor coatings. However, if according to the invention the superposed conductor strip portions have different configurations and/or dimensions, parallel shifting within the manufacturing tolerances is allowed without causing a change in the value of the capacity to be provided; owing to the different configurations and/or dimensions of superposed conductor strip portions the latter are magnetically in a way causing the overall inductance to be nearly independent of positional tolerances of the conductor strip portions relative to one another.

In a further modification of the above explained embodiment the conductor strip portions having the larger dimensions or width are arranged externally of conductor strip portions with smaller dimensions. In this way, effective shielding of the inwardly disposed conductor strip portions is attained, which is particularly favorable when the electric unit is a resonant circuit whose higher impedance components can be arranged inside the lower impedance components and shielded by the latter.

The invention further concerns a method for manufacturing the identification device. According to the invention for the manufacture thereof a conductor strip structure capable of being unfolded into a single plane is folded along at least one fold line such that conductor strip portions disposed in at least two superposed layers, especially planes, cooperate to form an inductive member, and between at least two conductor strip portions folded one upon the other a dielectric is interposed to form the capacitive member.

In order to minimize the manufacturing costs the conductor strips are preferably cut or punched out of a metal foil. For easy handling or processing of the punched-out conductor strips they may be applied on a flexible, electrically insulating carrier sheet which, after folding, also ensures mutual insulation of the superposed conductor strip portions. However, the conductor strips could just as well be provided with an insulating coating on one or both sides.

According to another embodiment of the method of the invention the conductor strips are etched out of a metal foil which may be applied on an electrically non-conductive flexible carrier sheet.

According to a further embodiment of the method of the invention the conductor strips are vapor-deposited, sprayed or applied by other conventional methods, e.g. by electrodeposition or the like, on a flexible electrically non-conductive carrier sheet.

The dielectric may be applied either directly on the respective conductor strip portions in the form of a coating, or a dielectric film is interposed between the conductor strip portions when the conductor strip structure is folded together.

In order to protect the final resonant structure it may be sealed into an electrically insulating flexible sheet or embedded into a flexible electrically insulating composition and brought into the shape of a flexible tag-like strip. Although the resonant structure may consist of numerous layers the tag-like strip may be very thin and flexible so that, if a plurality of individual structures is sealed into a continuous carrier sheet to form a plurality of individual identification devices, a plurality of individual identification devices can be continuously rolled up into a supply roll.

Identification devices manufactured according to the method of the invention, despite very low manufacturing costs, exhibit close tolerances of the resonant frequency and a satisfactory Q-factor. They are protected against non-destructive manipulation and therefore suited for safeguarding systems meeting severe requirements.

BRIEF DESCRIPTION OF THE DRAWING

Further advantages and features of the invention will become apparent from the following description of several examples of the invention with reference to the attached drawing, from the subclaims, and from the drawing. In the drawing FIG. 1 shows a schematic view of a conductor strip structure formed as a plane which, when suitably folded together, results in an inductive member;

FIG. 2 is a cross sectional view of a conventional strip line;

FIGS. 3a to 3c show several schematic views for explanation of folding of the conductor strip structure illustrated in FIG. 1;

FIGS. 4 and 5 are partial sections through the folded structure shown in FIG. 3;

FIG. 6 is an equivalent circuit diagram of the electrical unit shown in FIG. 1 and FIGS. 3 to 5 forming a parallel resonant circuit.

FIG. 7 is a plan view of a carrier sheet carrying a plurality of conductor strip structures for the manufacture of identification devcies;

FIGS. 8, 9 and 10 are schematic views for explanation of further embodiments of the invention permitting adjustment of the capacitive member in the course of the manufacturing method;

FIG. 11 is a section through a marginal zone of a final identification device carrying a resonant structure sealed into a protective external sheath;

FIG. 12 is a schematic view of a carrier sheath rolled up into a supply roll into which a plurality of final resonant structures is sealed and which is adhesive;

FIG. 13 is a plan view on a conductor strip structure formed as a plane for the manufacture of an outwardly shielded identification device with four superposed planes and increased inductance;

FIG. 14 is a plan view on a conductor strip structure for the manufacture of an identification device with eight or more superposed fold planes;

FIGS. 15 and 16 are schematic views for explanation of the manufacture of an identification device with only two fold planes;

FIGS. 17 and 18 are schematic views for explanation of an embodiment in which only capacitive coupling exists between two superposed planes;

FIG. 19 is an equivalent circuit diagram of the embodiment of FIGS. 17 and 18.

FIG. 24a is a plan view on a folded conductor strip structure able to resonate with a dielectric spaced between;

FIG. 24b is a cross sectional view of the folded conductor strip structure of FIG. 24a.

DETAILED DESCRIPTION OF THE PREFERED EMBODIMENTS

Figure 20:
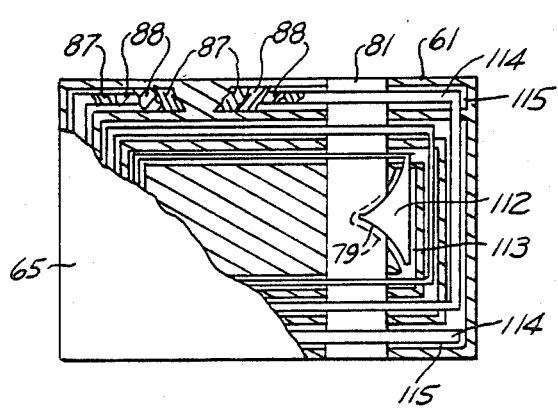
FIG. 20 is a schematic view for explanation of the adjustment of the capacitive member in the embodiment of FIGS. 17 and 18 by means of a dielectric adjustment tape.

The essential element of the identification device according to the invention is an electrical unit constituting a parallel resonant circuit and being formed of an inductive member and distributed capacities. Hereafter this electrical unit will first be described.

Since the described resonant circuit can be manufactured especially rapidly and simply with a minimum of waste of raw material, it is especially useful for provision in merchandise price tags and safeguarding tags.

From a thin metal foil which may already be inseparably coated on one or both sides with suitable dielectric coatings, a planar structure 30 having the structure of a conductor strip as shown in FIG. 1 is produced. It is an essential property of the conductor strip structure consisting of four coherent partial structures 31 to 34 (hereinafter termed "leaves" and illustrated in simple sketches as continuous leaves) that, although it appears to be symmetrical with respect to the center point 35, all the conductor strip portions symmetrically opposed with respect to the axis 36 have different widths so that symmetrical pairs differ in width only by one width step. By way of explanation FIG. 2 is a cross section through a stripline consisting of a wave guide strip 37, a dielectric of constant thickness 38, and a ground area 39 which is wider than the width of the wave guide strip. When the wave guide strip is laterally shifted this does not affect the capacitance per unit length thereof. In case the conductor strip structure shown in FIG. 1 is manufactured from an uncoated metal foil, it will be folded as shown in the simplified sketches of FIG. 3a, FIG. 3b and FIG. 3c along the fold lines 43, 44 and 36 in FIG. 1 with interposition of the dielectric layers 40, 41 and 42, so as to result in a cross section through any desired marginal part of the folded assembly shown in FIG. 4. FIG. 3a, FIG. 3b and FIG. 3c schematically display subsequent steps of the folding procedure. In case the conductor strip structure shown in FIG. 1 is manufactured from a metal foil previously laminated with suitable dielectric coatings 45 and 46 the insertion of the layers 40, 41 and 42 is unnecessary, and after analogous folding a corresponding cross sectional configuration illustrated in FIG. 5, i.e. altogether a rectangular structure with an open-window-like recessed inside region is obtained.

In both cases a Thomson resonant circuit is formed having a resonant capacity composed of the transformation of distributed conductor capacitances and concentrated capacitances of the opposed conductor strip portions 47 and 48, 47 and 49, 48 and 50. In a rough approximation the structure can be described by the equivalent circuit shown in FIG. 6; therein corresponding parts and locations are designated with the same reference numerals as in FIG. 1.

The different widths in folded condition of superposed conductor strips serve for several functions:

(a) Inaccuracies in superposing the individual leaves hardly change the capacitance between conductor strip portions arranged at least marginally aligned one above the other, as long as a positioning tolerance is maintained within geometrically simply determinable and specifiable limits. This effect can be utilized as long as the widths of the conductor strips are far greater than the thickness of the dielectric separating layers and the electric field between metal layers thus configures predominantly homogeneously. As a result, the overall effective resonant circuit capacitance is substantially invariable with respect to positioning inaccuracies on folding within registration tolerances and mainly depends on the dimensional accuracy of the conductor strips and on properties of the dielectric.

(b) Since the conductor strips mutually cover each other and the width of the conductor strips is substantially greater than the thickness of the insulating separating layers between the coil windings, the coupling of the spatially distributed windings is very close and the mutual leakage inductance thereof is very low. This results in very constant transformation conditions for the individual distributed line capacitances.

(c) After having been folded together the leaves 32 and 33 of low impedance in relation to the center point 35 of the structure in FIG. 1 and the coil center 35 of FIG. 6, are disposed at the outside of the arrangement and enclose the leaves 31 and 34 of high impedance in relation to the same points in the manner of a static shield in the interior of the arrangement with the result that upon getting close to capacitively influencing objects the obtained structure only slightly changes its resonant frequency. The branches 51 and 52 are not a component of the coil proper but are low impedance shielding areas which shield the higher impedance line sections 53 and 54 against the outside.

(d) The externally disposed windings of maximum conductor widths, i.e. of least strip resistance, are the windings in which the highest current flows. Hence, the design of the device also favors a highest possible Q-factor.

High positioning accuracy of the individual leaves placed one upon the other is ensured by positively enforced folding. Such folding is achieved by fixing in the production process the conductor strip structure shown in FIG. 1 onto a continuous carrier sheet 56 as shown in FIG. 7, and within the same tool when performing this operation, the fixd structure together with the carrier sheet 56 are subsequently perforated in a continuous manner with zero track offset shift relative to the fixed structure along the lines 43, 44 and 36 in FIG. 1 so that perforation lines 57, 58 and 59 are formed along the direction of advance of the sheet 56, as shown in FIG. 7, along which the continuous sheet can be folded together.

The perforation is made such
that an electrically conductive connection is retained through the perforated region of the structure;
that the longitudinal stiffness of the substrate material can be utilized to enhance guided folding; and
that portions of the carrier sheet no longer needed can be removed once these portions of the sheet have been inwardly folded along the perforation.

If, for the production of the structure shown in FIG. 1, a metal foil dielectrically coated on both sides is used as starting material, the insertion of the sheet-like insulating layers 40, 41 and 42 during folding is unnecessary. Since the dielectrically reacting layers shown in FIG. 5 then have the same contours as the conductor strips, the interiors and exteriors of the finally folded device are then free of any material so that the arrangement, when folded together, does not yet have a form stable in itself.

The production and dimensional stability of the arrangement between protective covering faces may be accomplished, in a manner shown in FIGS. 7, 8 and 9, by using as continuous carrier sheet 56 a material suited for this purpose and provided, for example, with prepared fields 60 to contain or carry printed information, and having on the free side an adhesive or sealing layer 61 producing differential adhesion in the zones inside and outside the perforation lines 57 and 58 capable of being selectively activated, e.g. under the influence of pressure and/or heat. After the transfer of the structure consisting of the leaves 31 to 34 to such a carrier sheet the zone-wise differential adhesion has the effect that the leaves 32 and 33 initially adhere more firmly to the sheet 56 than do the leaves 31 and 34.

By means of a suitable method an extremely thin adhesive layer 62 is applied onto the surface of the conductor strip structure, but not onto the sheet, as indicated in FIG. 7, which, after inwardly folding along the lines of perforation 57 and 58, produces higher adhesiveness between the leaves 31, 32 and 34, 33 respectively than that initially produced between the sheets 32, 33 and the sheet 56.

After the performance of the first folding operation along the lines of perforation 57 and 58 which adhesively positions the leaves 31, 32 and 34, 33 on each other, this permits the separation and removal of carrier sheet portions 63 and 64 no longer required along the perforation lines 57 and 58, as shown in FIG. 8, without the conductor strip structure being removed from the remainder 65 of the carrier sheet. The second folding operation along the perforation line 59 then positions the leaves 31 and 34 on each other, as illustrated in FIG. 9.

When, after the last folding operation which closes the structure to form a resonant circuit, the adhesive or sealing layer 61 inside the portion 65 of the carrier sheet 56 which remained as external sheath is activated in a suitable way, e.g. under the influence of pressure and/or heat, the described structural feature has the additional effect that the folded structure incorporated between sheating layers not only is enclosingly sealed from its recessed interior, but also is enclosingly sealed along the external perforation margins in the areas 69. This ensures high stability of the device against displacement so that the resulting strip can be rolled up into a supply roll.

By way of illustration FIG. 11 shows a cross section through the external region of a device produced in this way.

According to FIG. 12, with this method a great number of thin and flexible resonant members 70 can be produced which are encased in a continuous sheath, this construction representing a plurality of identification devices being subsequently arranged in a continuous strip. They can be either cut off individually from said continuous strip or, after a severing perforation 71 and provision with pressure sensitive adhesive 72 and delaminating film 73, can be flexibly transferred to articles by means of automatic roll-off dispensers.

In a continuous manufacturing process of the described type the resonant frequency of the identification device can be maintained within predeterminable frequency limits regardless of any occurring variations of the properties of the dielectrics 45, 46 and 40, 41, 42, of the adhesive layer 62, or of the carrier sheet 56 and of any other process parameters in that, according to FIG. 10, contours 79 of capacitively reacting adjusting conductor strip portions 80 are provided obliquely relative to the direction of advance of the carrier sheet, and between said conductor strip portions 80 a continuous insulating tape 81 of sufficient width and having a rather low dielectric coefficient and sufficient thickness is inserted so as to extend in the direction of advance of the carrier sheet. Thereby the effectively resulting circuit capacitance and thus the resonant frequency of the final identification device can be influenced in response to the track spacing 82 of said adjusting tape from the perforation line 59.

In this way a suitable designed closed loop control servo device which contactlessly detects the actual frequency of manufactured devices, continuously compares it with a predetermined set frequency, and the dynamic of which is tunable to the number of manufactured devices per unit of time, can control the maintenance of predetermined resonant frequency limits automatically via control of the track spacing.

The insertion of such an adjusting. tape 81 can be effected either by rolling it onto the still unfolded structure after application of the adhesive layer 62 by utilizing the adhesion of said very layer, as shown in FIG. 10, or can be effected in the same way after the first folding operation by utilizing selective adhesive properties of the carrier sheet, as indicated in FIGS. 8 and 9, depending on the desired adjusting sensitivity.

The inductance can be increased and the shielding effect improved while retaining the four-leaf principle shown in FIG. 13 by increasing the number of windings of the leaves inwardly disposed after folding. To this end the conductor strip portions 83 and 84 acting as capacitor coatings may be so arranged that they come to lie below the two outwardly disposed halves of the central conductor strip 86 of the structure last folded along the line 85 which has the lowest coupling impedance. This further improves the minimal effect on the resonant frequency if such a resonant structure approaches capacitively influencing objects.

The same effect is achieved when there are more than four leaves to one structure. The possible form of a multi-leaf structure which may also be asymmetrically continued on both sides in meander-fashion, is illustrated in FIG. 14. The required stepping of the conductor strip widths is only sketched.

Figure 15:
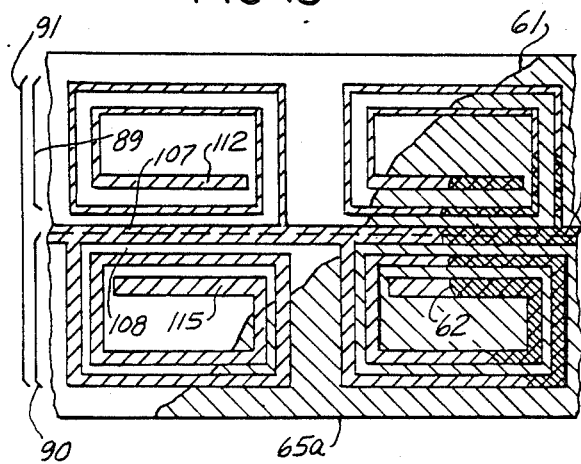

Two-leaf devices can be produced rapidly and especially simply by producing from a thin metal foil 87 provided with a suitable dielectric coating 88 a flat conductor strip structure 91 composed of two partial leaves 89 and 90, as illustrated in FIG. 15, fixing it on an adhesive or sealable carrier sheet 65a, and then folding the latter together with the conductor strip structure fixed thereto along a line of perforation 92 produced with zero track offset shift relative to the fixed conductor strip structure and continuously penetrating the conductor strip structure and the carrier sheet so that the dielectric coatings are encased between the conductor strips of the folded structure. Here, too, the principle of electric conductance through a zone of perforation along a fold line is applied. If the starting material is a metal foil 87 bearing no dielectric coating 88, a dielectric 93 must be inserted between the two partial leaves as shown in FIG. 16. In this case, too, a Thomson resonant circuit with distributed capacitances is formed.

Experimental samples showed that fixing by a special adhesive layer 62 of the dielectric layers 88 to one another or of the conductor strip 87 to a dielectric 93 to be inserted becomes unnecessary if the structure is enclosed all around in the sheathing material 65 by a suitable sealing layer 61.

In this embodiment, too, capacitor areas are most favorably disposed so that they are oriented lengthwise in winding direction, because in this way, as an integral part of the coil winding, they permit a maximum induction area with a minimum of field distortion.

If the mutually superposed conductor strips are sufficiently large, predominantly capacitive conductor areas are unnecessary so that when the windings are open-ended, in the interior of the leaf structures, see FIGS. 24a and FIG. 24b showing such two-leaf conductor strip structure, its leaves 93 inserted between, the sheathing carrier sheet 65a being omitted.

If one departs from the principle of electrical conduction through a perforated zone along a fold line and in the embodiment of FIG. 16 the electrically conductive connection along the perforation line 92 is separated, one obtains a parallel resonant circuit, as shown in FIG. 19, with series arranged inductances 103 and 104 and series arranged capacitances 105 and 106 in that the capacitance per unit length becomes active as a serial capacitor 106 between the then mutually insulated conductor strip halves 107 and 108 along the perforation line 92. In FIG. 19 also the distributed capacitances between superposed areas of the windings are indicated.

Such embodiment can be produced rapidly and simply, again with the application of the principle of marginally unlike overlying conductor strip widths for extensive frequency invariance relative to positioning inaccuracies, in that from a thin metal foil 87—which may already be provided with a suitable dielectric coating 88 on one side—two separate planar structures 109 and 110 are produced as shown in FIG. 17, and are fixed on an adhesively or sealably provided carrier sheet 65; when performing this operational step the latter is subsequently perforated in a continuous manner between the structures with zero track offset shift relative to the fixed conductor strip structures, so that together with the conductor strip structures 109 and 110 positioned thereon—with a dielectric 93 inserted therebetween, if necessary—it may be folded along the perforation line 111 being generated so that the two conductor strip structures 109, and 110 lie in alignment one upon the other and are capacitively, rather than conductively, coupled through the insulating interlayer 88 or 93, as shown in FIG. 18, and the thus obtained resonant member is sealed on all sides within the carrier sheet 65 forming a protective sheath. In order to influence the resonant frequency, again an adjusting tape 81 is provided (FIG. 20) cooperating with adjusting areas 112 and 113 as explained in detail with reference to FIG. 10. The adjusting areas 112 and 113 are so constructed that there is approximately square response of the adjustment capacitance to the parallel shift of the adjustment tape 81, or linear response to the resonance frequency to said parallel shift.

Since the described identification device can be produced not only very rapidly and simply, but also with a minimum of raw material waste, it is especially suitable for use as merchandise safeguarding identifying price tags.

Figure 21:
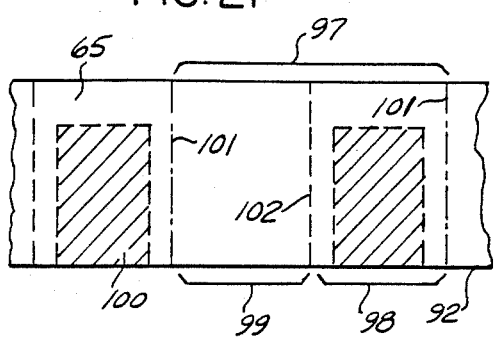
FIG. 21 shows a schematic plan view of a plurality of strip-shaped identification devices forming data carrying double price tags, each providing an area section containing a resonant structure and another area section not containing such.

According to FIG. 21, to this end a data-bearing double price tag 97 for example—consisting of a cash register section 98 provided with such a resonant member and a customer's section 99 without such a member—can be produced by using as production facilitating carrier 165 an accordingly pre-printed sheathing material suited as a data-carrier medium, and by leaving adequate space between the structures fixed to said carrier so that, after folding along the perforation line 92 and sealing of the carrier, there alternate in succession one area provided with a resonant member 100 and one area without such a member. Thereafter this strip is provided with transverse perforations 101 following the incorporated resonant members in predetermined spaced relation for separation of individual tags, and transverse perforations 102 therebetween for separating customer's and cash register sections.

In case merchandise and price data on such tags are not manually but automatically inputted into the cash register by special means provided for this purpose, such a resonant member can also be contained in the customer's section, provided the customer's section is punched in a suitable place in the read-in apparatus, directly after registration, and the resonant member in the interior thereof is thereby inactivated.

Since this device is not shielded against the environment, and merchandise safeguarding tags should be sized as small as possible, it may be that changes in the circuit capacitance and thus in the resonant frequency occur in case large areas thereof are covered by objects or body portions.

In order to minimize this effect, the following measures are taken according to preferred embodiments:

The sheathing material is made sufficiently thick, and the essential portion of the resonant circuit capacitance is located at the periphery of the device, i.e. commencing with the capacitance per unit length between the first windings and concentrated along the lines of perforation;

the ends of the coil are terminated with capacitive layers of only relatively small area;

the relative permittivity of the dielectric is made as high, and the relative permittivity of the sheathing material is made as low as possible.

As a component of electronic systems for theft detection of merchandise or for supervising the authorized access of persons conventional devices have been in use which comprise, in a rigid housing essentially consisting of two parts, a resonant circuit composed of a coil winding of bare of insulated wire and a capacitor of conventional design connected to the ends of the coil winding.

Figure 22:
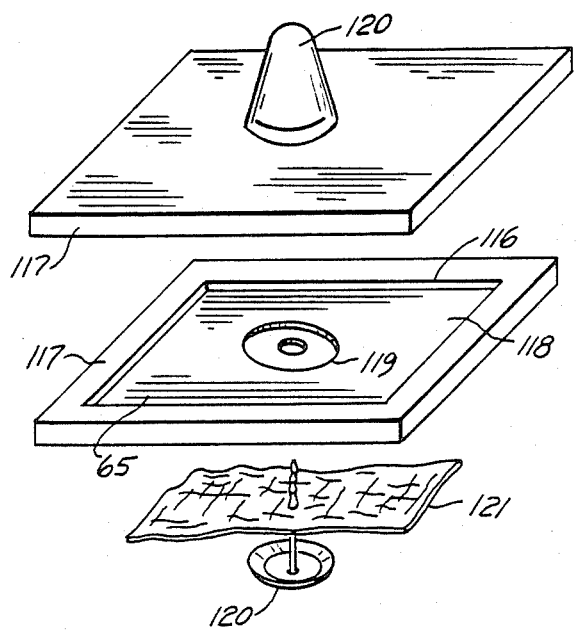
FIG. 22 shows an exploded view for explanation how an identification device of the invention can be affixed to an article to be safeguarded.

The assembly of these parts in the hitherto customary way may be obviated in that, according to FIG. 22, one of the described identification devices 118 is placed into an adequate flat recess 116 in the interior of a such designed casing 117 of well-known kind; the paper or cardboard-like carrier sheath 65 of such a device can be provided with a perforation 119 within the encased resonant structure in order to receive a closing mechanism 120 that may be required for detachable mounting of the entirely composed arrangement to garments 121.

Figure 23:
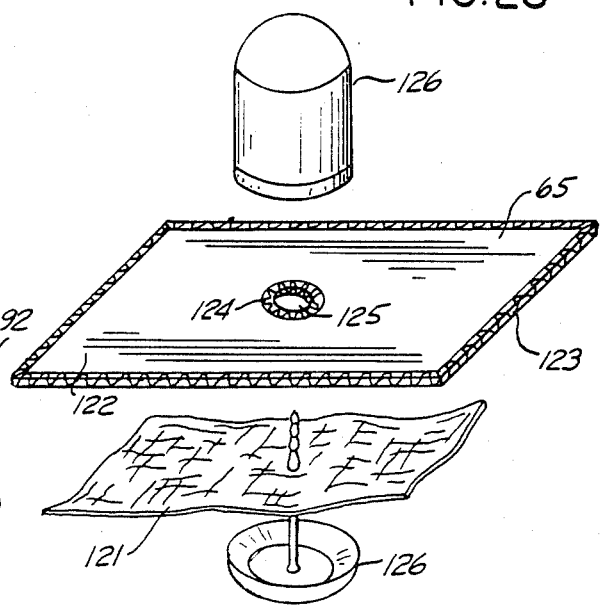
FIG. 23 is an exploded view of another embodiment of affixing an identification device to an article to be safeguarded.

If such a closing mechanism need not be inseparably connected to an identification device, and if the identification device itself is to be designed as a flexible, resistant, repeatedly usable tag 122, such a tag can be produced, according to FIG. 23, in that as production facilitating carrier 65—and thus as sheathing material of the resonant member—a sufficiently thick, tear-resistant material with bend-resistant reinforcement is used which can be sealed, if required, by a sealed seam 123 along the margins to render the device tear resistant.

A bore 125 in the inner area of such a tag whose margin is likewise reinforced by sealing 124 may permit detachable mounting to merchandise 121 with customary devices 126 of well-known kind and suitable for this purpose.

I claim:

1. For use in electronic security systems, an identification device in the form of a tag-like strip containing a substantially planar resonant circuit comprising:

an inductive member and a capacitive member, said inductive member and said capacitive member consisting of at least a first both inductively and capacitively reacting element and a second both inductively and capacitively reacting element being arranged in at least a first and a second plane, respectively, said at least first both inductively and capacitively reacting element consisting of at least a first arrangement of flat conductor strips in said at least first plane, said at least second both inductively and capacitively reacting element consisting of at least a second arrangement of flat conductor strips in said at least second plane, said at least first and second both inductively and capacitively reacting elements being arranged in an aligned opposition, spaced one from another by at least one dielectric layer, said at least one dielectric layer extending at least on mutually opposing surfaces of said at least first and second arrangements of flat conductor strips forming said at least first and second both inductively and capacitively reacting element, respectively, said aligned opposition of said at least first and second both inductively and capacitively reacting elements providing an aligned overlay of said at least first and second arrangements of flat conductor strips such that any mutually opposing segments of at least first and second flat conductor path portions of said at least first and second arrangements of flat conductor strips capacitively interact to a maximum extent with one another, said at least first and second arrangements of flat conductor strips cooperating to form a coil having continuous turns of substantially uniform winding direction when viewed from one side of said planes, said opposing segments of at least first and second flat conductor path portions spaced one from another by said at least one dielectric layer thus cooperating to form an individual LC stripline portion having a distributed line capacitance and a distributed line inductance, said aligned overlay of said at least first and second arrangements of flat conductor strips thus representing the summed totality of all said individual LC stripline portions cooperating to form an LC circuit, said cooperation of said individual LC stripline portions to form an LC circuit thus being realized by said at least first and second flat conductor strips being arranged in said at least first and second respective planes and being spaced by said at least one dielectric layer forming a plurality of individual LC stripline loop portions, said individual LC stripline loop portions being cascadingly stacked to form an LC stripline circuit construction exhibiting distributed line capacitances integrally summing to an overall effective capacitance owing to the surface areas of said mutually opposing at least first and second flat conductor strips and properties of said at least one dielectric layer spacing them one from another, and exhibiting distributed line inductances integrally summing to an overall effective inductance owing to distributed mutual magnetic coupling factors between said at least first and second flat conductor path portion arranged in an aligned overlay, said overall effective capacitance and said overall effective inductance and said distributed mutual magnetic coupling factors causing the capability of such said LC stripline circuit construction to resonate, said LC stripline circuit construction formed by a plurality of individual LC stripline loop portions being cascadingly stacked thus forming a substantially planar resonant circuit, said substantially planar resonant circuit being provided with a suitable cover to form said tag-like strip.

2. Device according claim 1, wherein said inductive member and said capacitive member consist of a first and second and third and fourth both inductively and capacitively reacting element being arranged in a first and second and third and fourth plane, respectively, said first and second and third and fourth both inductively and capacitively reacting elements consisting of first and second and third and fourth flat conductor strips being arranged in said first and second and third and fourth planes respectively, said first and second and third and fourth both inductively and capacitively reacting elements being conductively interconnected one with another such that said first and second and third and fourth both inductively and capacitively reacting elements—when unfolded from their individual, respective planes—in succession form a substantially continuous, flat conductor path pattern of said interconnected first and second and third and fourth flat conductor strips capable of extending into a single plane, said first and third conductor strips—when unfolded from their individual, respective planes to form said substantially flat conductor path pattern capable of extending into a single plane—having the same essentially uniform first direction of curvature, and said second and fourth conductor strips—when unfolded from their individual, respective planes to form said substantially flat conductor path pattern capable of extending into a single plane—having the same and essentially uniform second direction of curvature, first and second directions of curvature being in opposition, said first and second and third and fourth both inductively and capacitively reacting elements being arranged in an aligned opposition, any two spaced one from another by at least one dielectric layer, said aligned opposition being made such that, upon folding said substantially flat conductor path pattern capable of extending into a single plane, said first and said fourth flat conductor strips are single-end connected to said second and said third conductor strips and are in mutual opposition, and said second and said third flat conductor strips are interconnected both one with another and with said first and said fourth conductor strips and are in overlying opposition enclosing said first and fourth flat conductor strips, and said LC stripline circuit construction exhibits a distributed capacitance and a distributed inductance being formed by a plurality of individual LC stripline loop portions being cascadingly stacked in a three dimensional way orthogonally to the plane in to which said LC stripline circuit construction extends, said LC stripline circuit construction thus engaging more than 50% of the overall conductor path surfaces to react capacitively and thus exhibiting a very low metallized share of the area covered by said LC stripline circuit construction.

3. Device according to claim 1, wherein
any mutually opposing flat conductor path portions have at least slightly differing path widths and are in an at least marginally aligned overlay opposition.

4. Device according to claim 1, wherein said flat conductor strips are arranged in more than two planes and said aligned overlay of flat conductor strips is made such that those conductor strips being arranged in the two external planes of the resonant circuit construction have greater strip widths than those conductor strips being arranged in internal planes between said externally disposed conductor strips, and any mutually opposing conductor path portions are in an at least marginally aligned overlay opposition, such construction providing electrostatic shielding of the conductor strips arranged in said internal planes between said externally disposed conductor strips.

5. Device according to claim 1, wherein said flat conductor strips are at least in part covered by an electrically insulating layer, and the dielectric spacing of any mutually opposing flat conductor strips is at least in part formed by their respective electrically insulating layers.

6. Device according to claim 1, wherein said flat conductor strips are at least in part covered by an electrically insulating layer, and the dielectric spacing of any mutually opposing surfaces of said flat conductor strips that are insulatively covered is formed by said electrically insulating layer, and the dielectric spacing of any mutually opposing surfaces of said flat conductor strips that are not insulatively covered is formed by an inserted dielectric sheet.

7. Device according to claim 1, wherein said flat conductor strips have first and second sides, their first sides being at least in part covered by an electrically insulating layer, wherein the dielectric spacing of any mutually opposing segments of said flat conductor strips comprising at least one first side is formed by said electrically insulating layer, and the dielectric spacing of any mutually opposing segments of said flat conductor strips comprising two second sides is formed by an inserted dielectric sheet.

8. Device according to claim 1, wherein said flat conductor strips have first and second sides, their first sides being at least in part covered by an electrically insulting layer, wherein the dielectric spacing of any mutually opposing segments of said flat conductor strips comprising at least one first side is formed by said electrically insulting layer and a first inserted dielectric sheet, and the dielectric spacing of any opposing segments of said flat conductor strips comprising two second sides is formed by a second inserted dielectric sheet.

9. Device according to claim 1, wherein said flat conductor strips have first and second sides, their first sides being covered by an electrically insulating layer, wherein the dielectric spacing of any mutually opposing segments of said flat conductor strips comprising a first and a second side is formed by at least said segments electrically insulative layer, and the dielectric spacing of any mutually opposing segments of said flat conductor strips comprising two first sides is formed by at least said electrically insulating layer of double thickness.

10. For use in an electronic security system, an identification device in the form of a tag-like strip affixable to an article, containing a substantially planar resonant circuit comprising an inductive member and a capacitive member, said inductive member consisting of a first both inductively and capacitively reacting element and a second both inductively and capacitively reacting element being arranged in a first and second plane, respectively, said first both inductively and capacitively reacting element consisting of a first conductive spiral pattern having multiple turns, said second both inductively and capacitively reacting element consisting of a second conductive spiral pattern having multiple turns, said first and second conductive spiral patterns being constituted by first and second flat conductor strips, respectively, being arranged in said first and second plane, respectively, said first and second conductive spiral patterns being arranged in a generally aligned opposition to each other, spaced from each other by at least one dielectric layer, said at least one dielectric layer extending at least on mutually opposing surfaces of said first and second flat conductor strips, said generally aligned opposition of said first and second conductive spiral patterns each having multiple turns being made such that corresponding portions of said first and second flat conductor strips are in substantial registration with each other, thus providing an aligned overlay of said first and second flat conductor strips, said first and second conductive multiple-turn spiral patterns having opposite directions of winding with respect to each other when both are viewed from the same side of said first and second planes of said at least one dielectric layer, said corresponding portions of said mutually opposing first and second flat conductor strips being spaced from each other by said at least one dielectric layer thereby capacitively engaging each other to a maximum extent, said mutually opposing flat conductor strip portions spaced one from each other by said at least one dielectic layer thus cooperating to form an individual LC stripline portion having a distributed line capacitance and a distributed line inductance, said generally aligned opposition of said first and second conductive spiral patterns providing an aligned overlay of said first and second flat conductor strips thus representing the summation of individual LC stripline portions cooperating to form an LC stripline circuit, said cooperation of individual LC stripline portions to form said LC stripline circuit being realized by a cascadingly stacked arrangement of a plurality of individual LC stripline portions exhibiting distributed line capacitances summing to an overall effective capacitance, distributed line inductances summing to an effective inductance and distributed mutual magnetic coupling factors between any two of said individual LC stripline portions, said cascadingly stacked arrangement of said plurality of individual an LC stripline portions being of the plane, concentric type and providing LC stripline circuit construction exhibiting a series of radially enlarging, individual closed LC stripline loops consisting of flat conductor strip portions of respective individual turns of said first and second conductive multiple-turn spiral pattern and said at least one dielectric layer spaced between, said LC stripline circuit construction thus enabling the entire surface of any first sides of said first and second flat conductor strips to react capacitively, thus yielding substantially 50% of all surfaces of said first and second flat conductor strips capacitively engaged, said overall effective capacitance and said overall effective inductance and said distributed mutual magnetic coupling factors causing said LC stripline circuit construction to resonate, said low metallized share of the area covered by the entire construction causing a high resonant Q, said LC stripline circuit construction thus representing a substantially planar resonant circuit, said substantially planar resonant circuit being covered by a suitable cover material to form said tag-like strip.

11. Device according to claim 10, wherein said generally aligned opposition of said first and second conductive spiral pattern is such that any mutually opposing flat conductor strip portions spaced one from another by said at least one dielectric layer have at least slightly differing path widths and are at least marginally aligned with respect one to another.

12. Device according to claim 10, wherein said first and second conductive spiral patterns provide a first and second conductive path along at least a part of the margin of said resonant circuit construction for conductively connecting first respective ends of said first and second flat conductor strips forming said first and second conductive spiral patterns.

13. Device according to claim 10, wherein said first conductive spiral pattern and said second conductive spiral pattern are spaced one from another by a homogenous dielectric sheet.

14. Device according to claim 10, wherein at least oen dielectric layer extends on the surface of one of said first and second conductive spiral patterns, forming a dielectric spiral pattern being precisely aligned with one of said first and second conductive spiral patterns.

15. Device according to claim 10, wherein said first and second conductive spiral patterns are spaced one from another by a homogenous dielectric sheet and a dielectric layer extending on the surface of one of said first and second conductive spiral patterns and forming a dielectric spiral pattern being precisely aligned with one of said first and second conductive spiral patterns.

16. Device according to claim 10, wherein said first and second conductive spiral patterns are spaced one from another by a first dielectric layer extending on one side of said first conductive spiral pattern, forming a first dielectric spiral pattern being precisely aligned with said first conductive spiral pattern, and a second dielectric layer extending on one side of said second conductive spiral pattern, forming a second dielectric spiral pattern being precisely aligned with said second conductive spiral pattern, said first and second dielectric spiral patterns being wound in clockwise and counter clockwise winding direction, respectively, when viewed from the same side of the plane into which they extend, and, having a first and second thickness of respective dielectric paths, said first and second dielectric spiral patterns thus spacing all mutually opposing first and second conductor path portions of first and second conductive spiral patterns by a dual dielectric layer comprised of said first and second thicknesses.

17. Device according to claim 10, wherein said first and second conductive spiral patterns are spaced one from another by a first dielectric layer extending on one side of said first conductive spiral pattern, forming a first dielectric spiral pattern being precisely aligned with said first conductive spiral pattern, and a second dielectric extending on one side of said second conductive spiral pattern, forming a second dielectric spiral pattern being precisely aligned with said second conductive spiral pattern, and a homogenous dielectric sheet arranged between said first and second dielectric spiral patterns which are wound in clockwise and counter clockwise winding direction, respectively, thus all mutually opposing first and second flat conductor path portions of first and second conductive spiral patterns being spaced by a triple dielectric layer being comprised of a first thickness of said first dielectric layer extending on one side of said first conductive spiral pattern, a second thickness of said second dielectric layer extending on one side of said second conductive spiral pattern, and a third thickness of said homogenous dielectric sheet.

18. Device according to claim 10, wherein said first and second flat conductor strips have opposing ends and the device further comprises a first and a second conductive and capacitively reacting tuning area conductively connected with respective opposed ends of said first and second flat conductor strips, said capacitively reacting tuning areas being at least marginally aligned with respect one to another, said at least one dielectric layer extending at least on one of the two mutually opposing surfaces of said first and second flat conductor strips and capacitively reacting tuning areas, respectively, a dielectric tuning member having the form of a thin dielectric layer and having a selectable location between said first and second capacitively reacting tuning areas and cooperating with the latter and said at least one dielectric layer such that, upon shifting the location of said dielectric tuning member in a tuning direction between said capacitively reacting tuning areas, the capacitance provided by said tuning areas and said dielectric layers therebetween varies according to a predetermined function in response to the shift coordinate.

19. Method for producing a plurality of individual identification devices in the form of a tag-like strip, each identification device having at least one self-contained and substantially planar resonant circuit which is integrally formed by both inductively and capacitively reacting elements exhibiting distributed inductances and distributed capacitances to engage in a mulit-loop LC stripline circuit construction, comprising the steps of:

providing an electrically insulating, continuous sheet, having first and second sides, providing at least said first side of said continuous sheet with a surface capable of being activated to sealantly adhere to a metal and to a dielectric and to itself under the influence of pressure and heat, repetitively printing said second side of said continuous sheet in a format corresponding to the desired repetition of finished tag-like strips, repetitively providing said continuous sheet with a geometrically precise pattern consisting of a first and a second component, said first component being a metalized pattern defining electrically conductive paths, said conductive paths having first and second sides, one side thereof being adhered to said sealantly activatable surface of said first side of said continuous sheet under the influence of pressure and heat, said second component having a non-metalized pattern which is made up by at least one line of perforation cuts penetrating at least said continuous sheet and being arranged relative to said electrically conductive paths along the sheet, continuously folding said continuous sheet along said at least one line of perforation cuts, so that any segments of said metalized pattern representing components of LC stripline portions respectively meet in an aligned manner, continuously sealing the folded continuous sheet under the influence of pressure and heat by at least sealing said sealantly activatable surface of said first side of said continuous sheet, thereby fixing opposing parts of said metalized pattern in precise superposition, providing said folded and sealed continuous sheet at least with one transverse line of perforation cuts between any two adjacent resonant circuits, winding up said folded and sealed and repetitively transversely perforated sheet to form a continuing strip comprised of a plurality of individual identification devices having the form of a tag-like strip when disposed thereof.

20. Method according to claim 19, wherein said metalized pattern defining electrically conductive paths is punched out of said metal foil, which on one side is coated by a first dielectric layer.

21. Method according to claim 19, wherein said metalized pattern defining electrically conductive paths is punched out of a metal foil being at least on one side covered by a dielectric layer, and the method further comprises providing a dielectric sheet on said metalized pattern affixed to said first side of said continuous sheet such that said continuous sheet at least in part is continuously covered by said dielectric sheet.

22. Method according to claim 19, wherein said metalized pattern defining electrically conductive paths is punched out of a metal foil, and the method further comprises providing at least one dielectric sheet on said metalized pattern affixed to said first side of said continuous sheet such that said continuous sheet at least in part is continuously covered by said dielectric sheet.

23. Method of producing a plurality of individual identification devices in the form of a tag-like strip, each identification device having at least one self-contained and substantially planar resonant circuit which is integrally formed by both inductively and capacitively reacting elements exhibiting distributed inductances and distributed capacitances to engage in a multi-loop LC stripline circuit construction, comprising the steps of:

providing an electrically insulating, flexible continuous sheet of defined dielectric properties and thickness, said sheet having first and second sides, providing at least said first side of said continuous sheet with a surface capable of being activated to sealantly adhere to a metal under the influence of pressure and heat, providing at least said second side of said continuous sheet with a surface capable of being activated to sealantly adhere to itself, repetitively providing said continuous sheet with a geometrically precise pattern consisting of a first and second component, said first component being a metalized pattern made from a metal and defining elctrically conductive paths, said conductive paths having first and second sides, the first sides thereof being adhered to said sealantly activatable surface of said first side of said continuous sheet under the influence of pressure and heat, said second component being a non-metalized pattern which is made up by at least one line of perforation cuts penetrating at least said continuous sheet and being arranged in relation to said electrically conductive paths, continuously folding said continuous sheet along said at least one line of perforation cuts so that any parts of said metalized pattern representing components of LC stripline portions respectively meet in opposed alignment spaced by the double layer of said continuous sheet, continuously sealing the folded continuous sheet under the influence of pressure and heat, thereby fixing opposing parts of said metalized pattern in precise superposition, providing said folded and sealed continuous sheet with one transverse line of perforation cuts between any two resulting resonant circuits, winding up said folded and sealed and repetitively transversely perforated sheet to form a strip of a plurality of individual identification devices having the form of a tag-like strip.

24. Method accoding to claim 23 further comprising the step of:

electrodepositively forming said electrically conductive path.

25. Method according to claim 23 wherein said metalized pattern defines a first and a second spiral pattern of electrically conductive paths such that said first and second spiral patterns are electrically connected and coextend on said first side of said continuous sheet, and folding said continuous sheet takes place proximate to the electrically conductive connection between said first and second spiral patterns of electrically conductive paths.

26. Method according to claim 23, wherein said second component of said geometrically precise pattern is a non-metalized pattern made up by at least one line of perforation cuts penetrating said continuous sheet and also penetrating at least one electrically conductive path of said metalized pattern through said at least one line of perforation transversely positioned along the sheet.

27. An identification device in the form of a tag-like strip affixable to an article and comprising at least one inductive member formed of flat conductor strips and a capacitive member formed of superposed conductor strip portions and an interposed dielectric, and forming with the inductive member a closed resonant circuit, said conductor strips being arranged on at least two areas formed by folding of the tag-like strip and being opposed to each other, those conductor strips which have larger dimensions being arranged electrically interconnected and having a continous configuration that can be developed into a single plane.

28. Device according to claim 27, wherein said conductor strips are arranged in at least three superposed areas.

29. Device according to claim 27, wherein those conductor strip portions having low electric impedance are arranged externally of the conductor strip portions having a high electric impedance.

30. The device according to claim 27, wherein said device is incorporated in a tag adpated to be affixed to merchandise, which tag has a customer section and a cash register section detachably connected to the former, said device being arranged at least in one of the two sections.

* * * * *